(12) United States Patent
Watanabe et al.

(10) Patent No.: US 11,320,056 B2
(45) Date of Patent: May 3, 2022

(54) VALVE DEVICE

(71) Applicant: FUJIKIN INCORPORATED, Osaka (JP)

(72) Inventors: Kazunari Watanabe, Osaka (JP); Kohei Shigyou, Osaka (JP); Kenji Aikawa, Osaka (JP); Tomohiro Nakata, Osaka (JP); Takahiro Matsuda, Osaka (JP); Tsutomu Shinohara, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 16/757,644

(22) PCT Filed: Oct. 22, 2018

(86) PCT No.: PCT/JP2018/039154
§ 371 (c)(1),
(2) Date: Apr. 20, 2020

(87) PCT Pub. No.: WO2019/087838
PCT Pub. Date: May 9, 2019

(65) Prior Publication Data
US 2021/0199205 A1    Jul. 1, 2021

(30) Foreign Application Priority Data

Oct. 31, 2017   (JP) .............................. JP2017-210282

(51) Int. Cl.
*F16K 7/16*         (2006.01)
*F16K 27/02*        (2006.01)
*H01L 21/67*        (2006.01)

(52) U.S. Cl.
CPC ............ *F16K 7/16* (2013.01); *F16K 27/0236* (2013.01); *H01L 21/67017* (2013.01)

(58) Field of Classification Search
CPC .... F16K 7/16; F16K 27/0236; F16K 27/0263; H01L 21/67017; Y10T 137/87716
See application file for complete search history.

(56) References Cited

U.S. PATENT DOCUMENTS 5,937,886 A * 8/1999 Girard ................ G01N 33/0006
                                                        137/3
6,209,571 B1   4/2001 Itoh et al.
(Continued)

FOREIGN PATENT DOCUMENTS

EP   0735302 A1 * 10/1996 ............ F15B 13/086
JP   3-168494 A      7/1991
(Continued)

OTHER PUBLICATIONS

Machine translation of JPH1047514A, retrieved May 6, 2021 (Year: 1998).*

(Continued)

*Primary Examiner* — Michael R Reid
(74) *Attorney, Agent, or Firm* — Greenblum & Bernstein, P.L.C.

(57) ABSTRACT

The present invention provides a miniaturized valve device capable of dramatically increasing the degree of freedom in arranging a flow path of a valve body while securing a necessary flow rate. The valve device includes a valve seat support provided in an accommodation recess and having a support surface with which a sealing surface of a valve seat abuts and supports a pressing force from the sealing surface; a diaphragm provided in the accommodation recess so as to abut and be separable from a seating surface of the valve seat and seals the opening side of the accommodation recess; the valve seat support having sealing surfaces which cooperates with a part of the inner wall surface of the accommodation recess to bock the communication between a primary flow (Continued)

path and a secondary flow path, and a detour passage that connects the primary flow path and a flow passage of the valve seat.

10 Claims, 9 Drawing Sheets

(56) References Cited

U.S. PATENT DOCUMENTS

| | | | |
|---|---|---|---|
| 7,152,629 B2* | 12/2006 | Tokuda | F16K 27/003 |
| | | | 137/884 |
| 2003/0155024 A1 | 8/2003 | Hanada et al. | |
| 2015/0075660 A1* | 3/2015 | Inada | F15B 13/0817 |
| | | | 137/884 |
| 2016/0178072 A1 | 6/2016 | Kitano et al. | |
| 2017/0212531 A1* | 7/2017 | Nagase | G05D 7/0635 |

FOREIGN PATENT DOCUMENTS

| | | |
|---|---|---|
| JP | 10-47514 A | 2/1998 |
| JP | 10-311451 A | 11/1998 |
| JP | 2003-21248 A | 1/2003 |
| JP | 2007-3013 A | 1/2007 |
| JP | 2015-36563 A | 2/2015 |

OTHER PUBLICATIONS

Machine translation of JPH03168494A, retrieved May 6, 2021 (Year: 1991).*
Machine translation of EP0735302 (Year: 1996).*
International Search Report issued in International Bureau of WIPO Patent Application No. PCT/JP2018/039154, dated Jan. 15, 2019.

* cited by examiner

VALVE DEVICE

TECHNICAL FIELD

The present invention relates to a valve device, a flow control device using the valve device, a fluid control device, a flow control method, a semiconductor manufacturing apparatus, and a semiconductor manufacturing method.

BACKGROUND ART

In various manufacturing processes such as semiconductor manufacturing processes, a fluid control device in which various fluid devices such as an open-close valve, a regulator, a mass flow controller, and the like are integrated is used in order to supply accurately measured process gases to a processing chamber.

In such a fluid control device as described above, integration is realized by arranging an installation block (hereinafter referred to as a base block) in which a flow path is formed along the longitudinal direction of the base plate instead of a pipe joint, and installing a plurality of fluid devices, including a joint block to which pipe joints and various fluid devices are connected, and the like on the base block (for example, refer to Patent Document 1).

PATENT LITERATURE

PTL 1: Japanese Laid-Open Patent Application No. 2007-3013

SUMMARY OF INVENTION

Technical Problem

Controlling the supply of process gases in various manufacturing processes requires higher responsiveness and requires that the fluid control device be as compact and integrated as possible and installed closer to the processing chamber to which the fluid is supplied.

Along with the increase in size of processing objects, such as the increase in size of the diameter of the semiconductor wafer, it becomes necessary to also increase the supply flow rate of the fluid supplied from the fluid control device into the processing chamber.

In a valve device used in a fluid control device, a fluid flow path is directly formed in a block-shaped valve body.

With the miniaturization of the fluid control device, it is naturally necessary to miniaturize the valve body. However, when the valve body is miniaturized, it is not easy to optimally arrange the flow path while ensuring the flow rate of the flow path. For example, in the case where, from a primary flow path into which the fluid flows, a secondary flow path through which the fluid having passed through the valve flows is branched into a plurality of branches, it is not easy to secure the cross-sectional area and the formation position of the flow path, and it is also difficult to downsize the valve body.

Further, when it is necessary to branch a flow of a fluid that have flown into the flow path on the primary side of the valve device into a large number of flows on the secondary side, it is necessary to form flow paths corresponding to the number of branched flows, and it is necessary to increase the size of the valve body.

It is an object of the present invention to provide a miniaturized valve device capable of dramatically increasing the degree of freedom in arranging the flow paths of the valve body while securing a necessary flow rate.

Another object of the present invention is to provide a valve device capable of branching a flow of a fluid that has flown into a flow path on a primary side into a large number of flows flowing on a secondary side while maintaining miniaturization of the device.

Solution to Problem

The valve device according to the first aspect of the present invention is a valve device comprising a block-shaped valve body, the valve body defining an accommodation recess opening at a surface of the valve body and containing a valve element, and primary and secondary flow paths connected to the accommodation recess, the valve element blocking direct communication between the primary flow path and the secondary flow path through the accommodation recess, and making the primary flow path and the secondary flow path communicate through the valve element.

Preferably, the valve body defines opposing top and bottom surfaces and side surfaces extending between the top and bottom surfaces, the accommodation recess is open at the top surface of the valve body, the valve element comprises:

a valve seat ha an annular seating surface formed on one end surface, an annular sealing surface formed on the other end surface, and a flow passage formed inside the seating surface and the sealing surface and passing from the one end surface to the other end surface, a valve seat support provided in the accommodation recess and having a support surface against which a sealing surface of the valve seat abuts and which supports a pressing force from the sealing surface, a diaphragm provided in the accommodation recess so as to abut and be separated from the seating surface supported by the valve seat support, the diaphragm making the flow passage and the secondary flow path communicates through a gap between the diaphragm and the seating surface, the valve seal: support having a sealing surface that cooperates with a part: of the inner wall surface of the accommodation recess to block the communication between the primary flow path and the secondary flow path, and a detour passage that connects the primary flow path and the flow passage.

More preferably, the primary flow path is open at a bottom surface of the valve body, the secondary flow path branches into a plurality of branches in the valve body, and the branched flow paths each opens at any one of a top surface, a bottom surface, and a side surface of the valve body.

The secondary flow path may include first and second secondary flow paths formed on opposite sides of the accommodation recess in the longitudinal direction of the valve body, and one end of the first and second secondary flow paths may be closed in the valve body, and the other end of the first and second secondary flow paths may be opened at a side surface of the valve body. More preferably, the first and second secondary flow paths are formed on a common axis extending in the longitudinal direction of the valve body.

In addition, a configuration may be adopted in which a sealing member is further provided between a part of an inner wall surface of the accommodation recess and the sealing surface of the valve seat support.

In this case, the sealing member may be configured to be crushed between a part of an inner wall surface of the accommodation recess and the valve seat support by receiving a pressing force from the valve seat.

Further, a configuration may be adopted in which the valve device comprises a positioning and pressing member for positioning the valve seat with respect to the support surface of the valve seat support and pressing the valve seat towards the support surface of the valve seat support, the positioning and pressing member having a flow path for making the flow passage of the valve seat and the secondary flow passage communicate through a gap between the diaphragm and the seating surface. Preferably, a configuration may be adopted in which the positioning and pressing member may be provided between the valve body and the diaphragm.

Still more preferably, a configuration may be adopted in which an actuator for driving the diaphragm is further provided, a casing accommodating the actuator is screwed into the valve body, and the positioning and pressing member presses the valve seat toward the support surface of the valve seat support by using a screwing force of the casing.

The flow rate control device of the present invention is a flow rate control device for controlling the flow rate of a fluid, the flow rate control device comprising the valve device as described above.

The flow rate control method of the present invention comprises using a fluid control device including a valve device having the above-described configuration for controlling the flow rate of a fluid.

The fluid control device of the present invention, is a fluid control device comprising a plurality of fluid devices that is arranged, wherein the plurality of fluid devices includes the valve device described above.

A semiconductor manufacturing method of the present invention comprises using the above-mentioned valve device for controlling the flow rate of the process gas in a manufacturing process of a semiconductor device requiring a process step using a process gas in a sealed chamber.

A semiconductor manufacturing apparatus of the present invention comprises a fluid control device for supplying a process gas to a processing chamber, the fluid control device including a plurality of fluid devices, wherein the fluid devices include the valve device as described above.

Advantageous Effects of Invention

According to the present invention, the accommodation recess is provided in the valve body, the valve seat support is accommodated in the accommodation recess, the communication between the primary flow path and the secondary flow path is blocked, and on the other hand, the flow passage of the valve seat supported by the valve seat support and the primary flow path are connected by the detour passage of the valve seat support. Accordingly, the primary flow path and the secondary flow path need only be connected to the accommodation recess, and the degree of freedom of arrangement of the primary flow path and the secondary flow path can be drastically increased.

Further, according to the present invention, by optimizing the arrangement of the primary flow path and the secondary flow path, it is possible to further downsize the valve body.

Further, according to the present invention, by branching the secondary flow path while optimizing the arrangement of the secondary flow path, a flow of fluid flown into the primary flow path can be branched into a large number of flows on the secondary side.

DESCRIPTION OF EMBODIMENTS

Figure 1A:
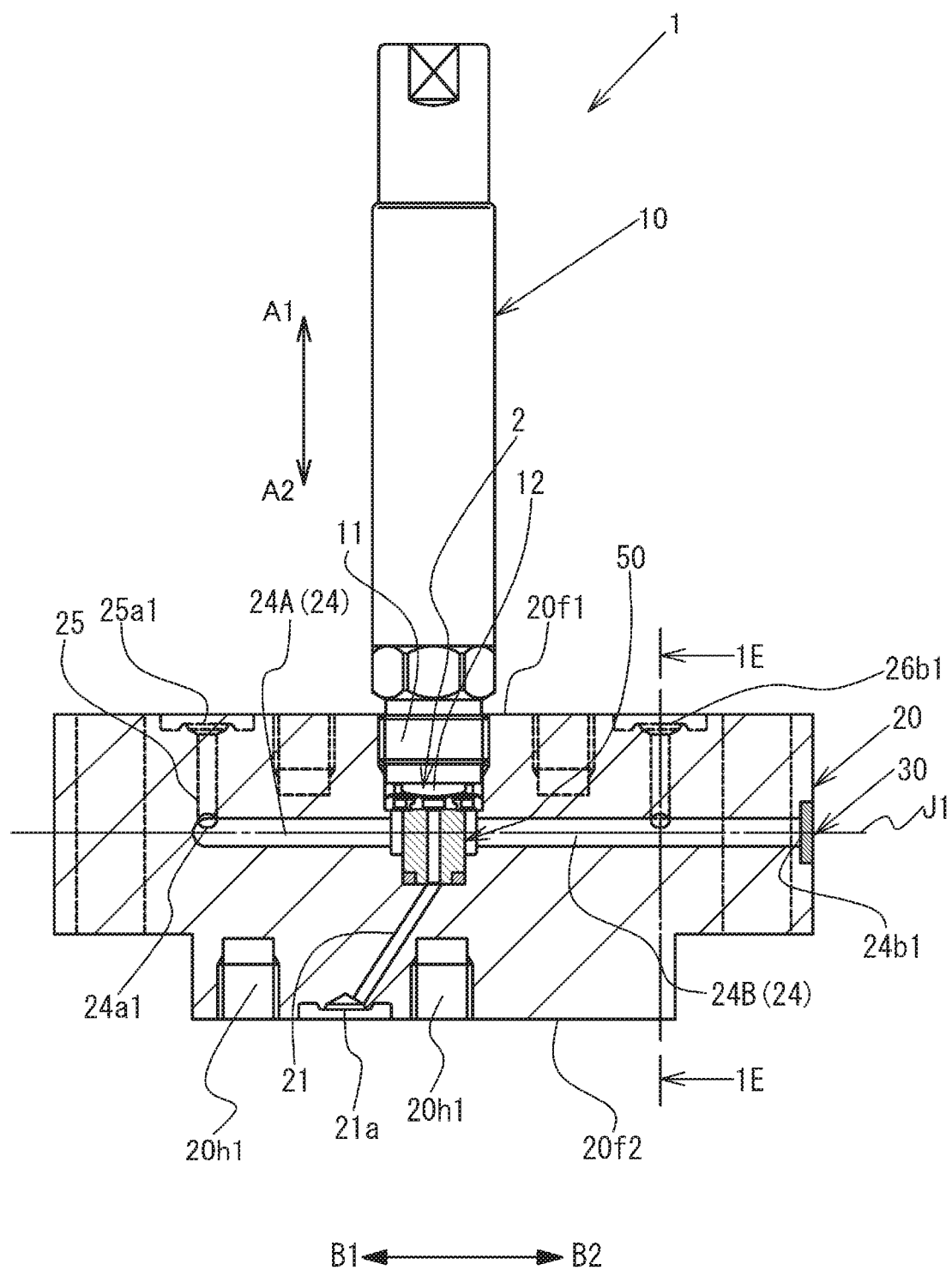
FIG. 1A is a front view including a longitudinal section in a portion of a valve device according to an embodiment of the present disclosure.
Figure 1B:
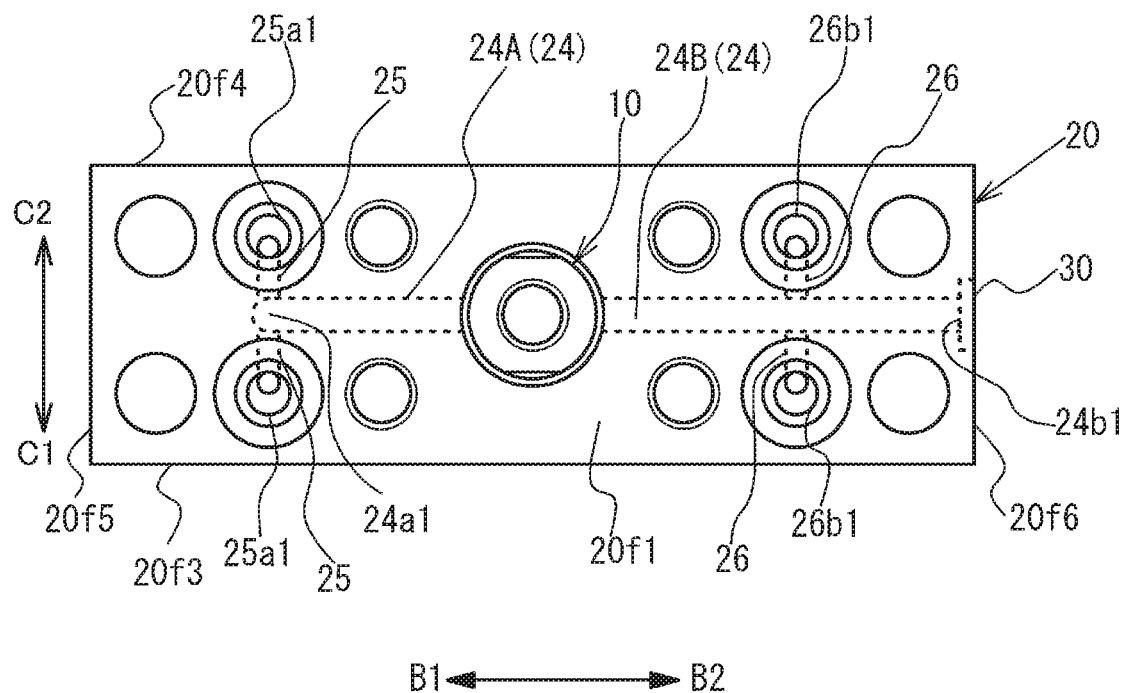
FIG. 1B is a top view of the valve device in FIG. 1A.
Figure 1C:
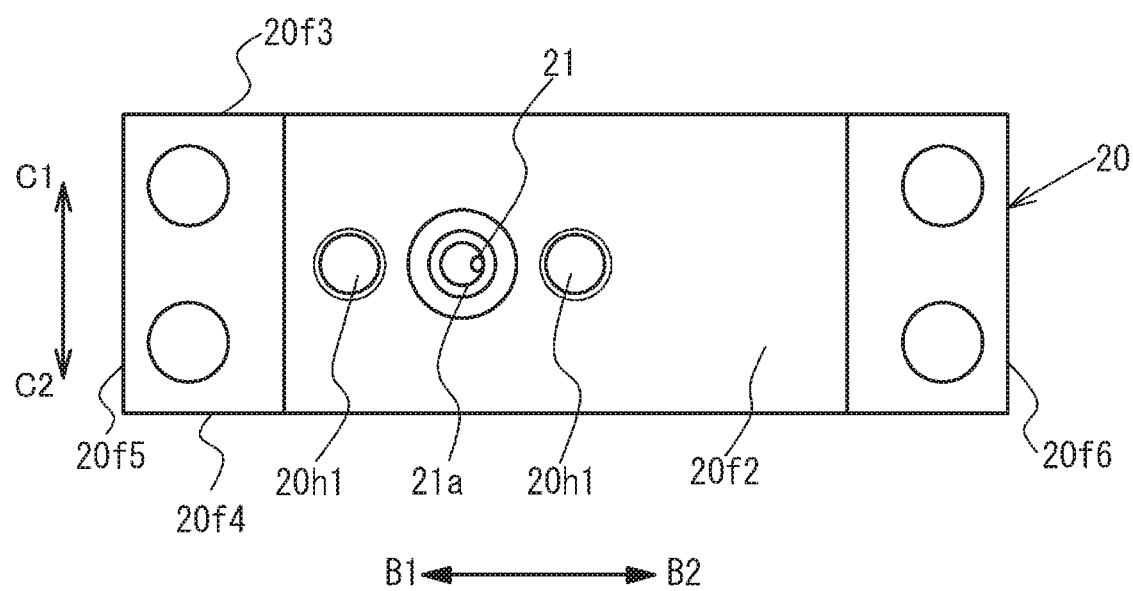
FIG. 1C is a bottom view of the valve device in FIG. 1A.
Figure 1D:
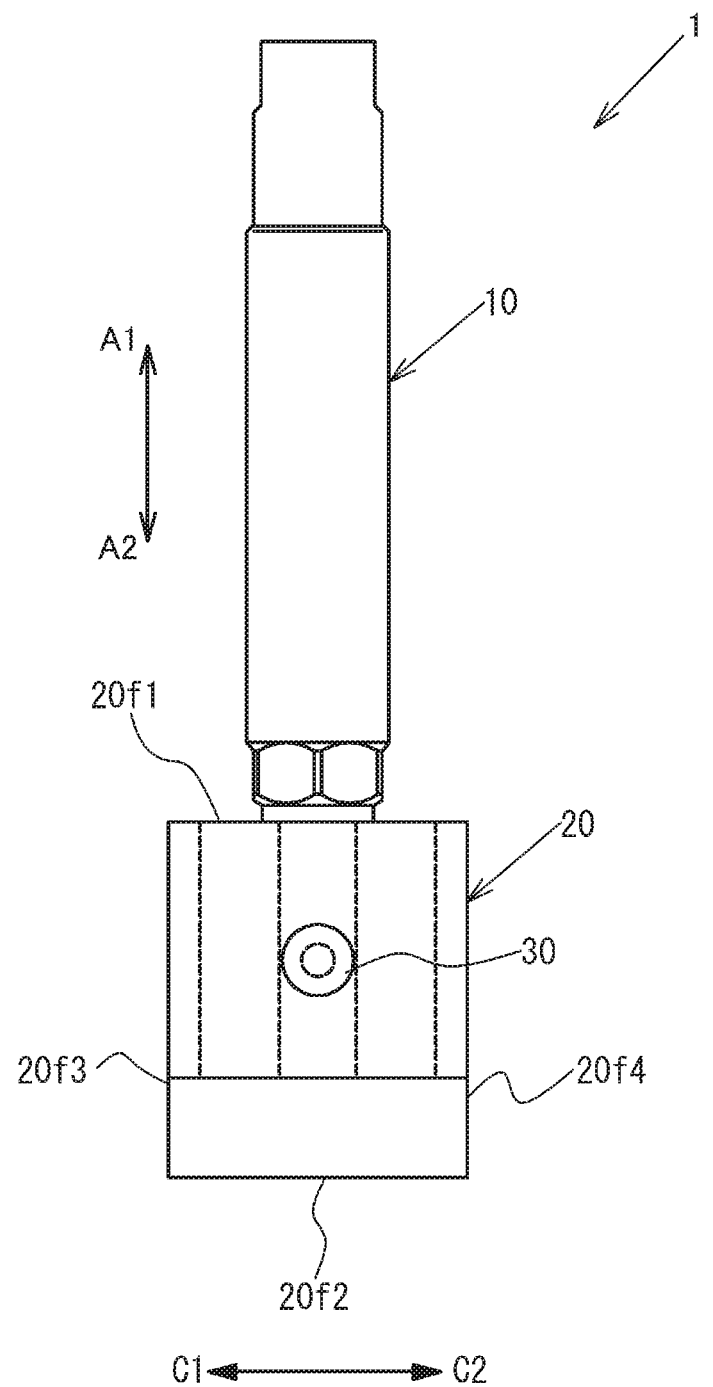
FIG. 1D is a side view of the valve device in FIG. 1A.
Figure 1E:
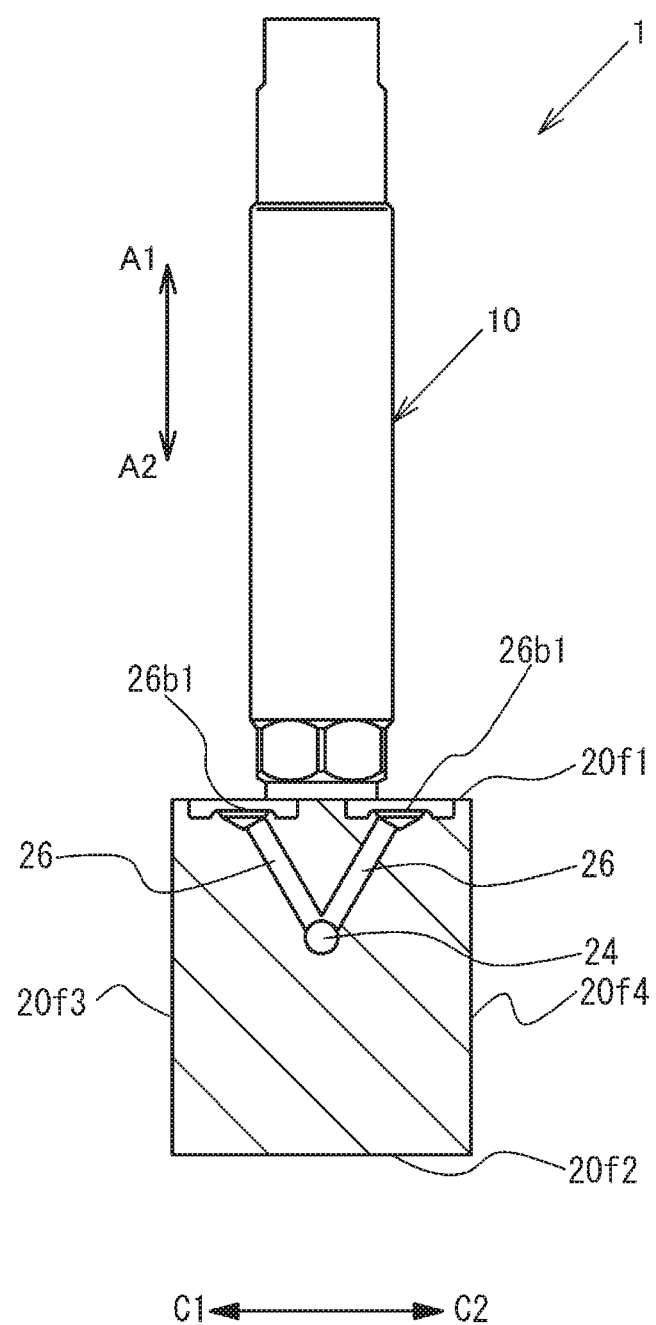
FIG. 1E is a sectional view along line 1E-1E in FIG. 1A.

Embodiments of the present invention will be described below with reference to the drawings. In the present specification and the drawings, the same reference numerals are used to denote components having substantially the same functions, and thus a repetitive description thereof is omitted.

Figure 2:
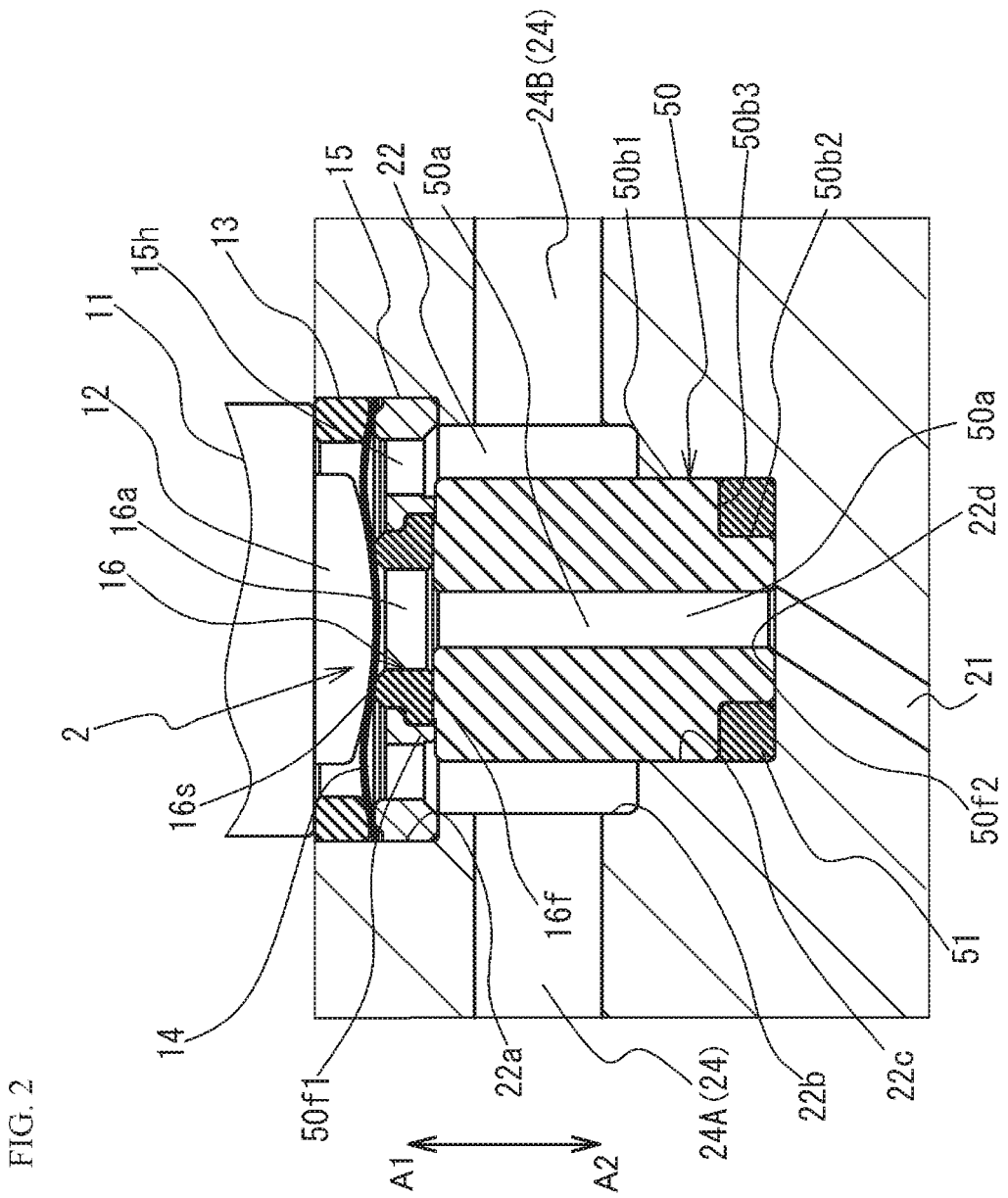
FIG. 2 is an enlarged sectional view of the main part of the valve device of FIG. 1A, showing the valve closed condition.
Figure 3:
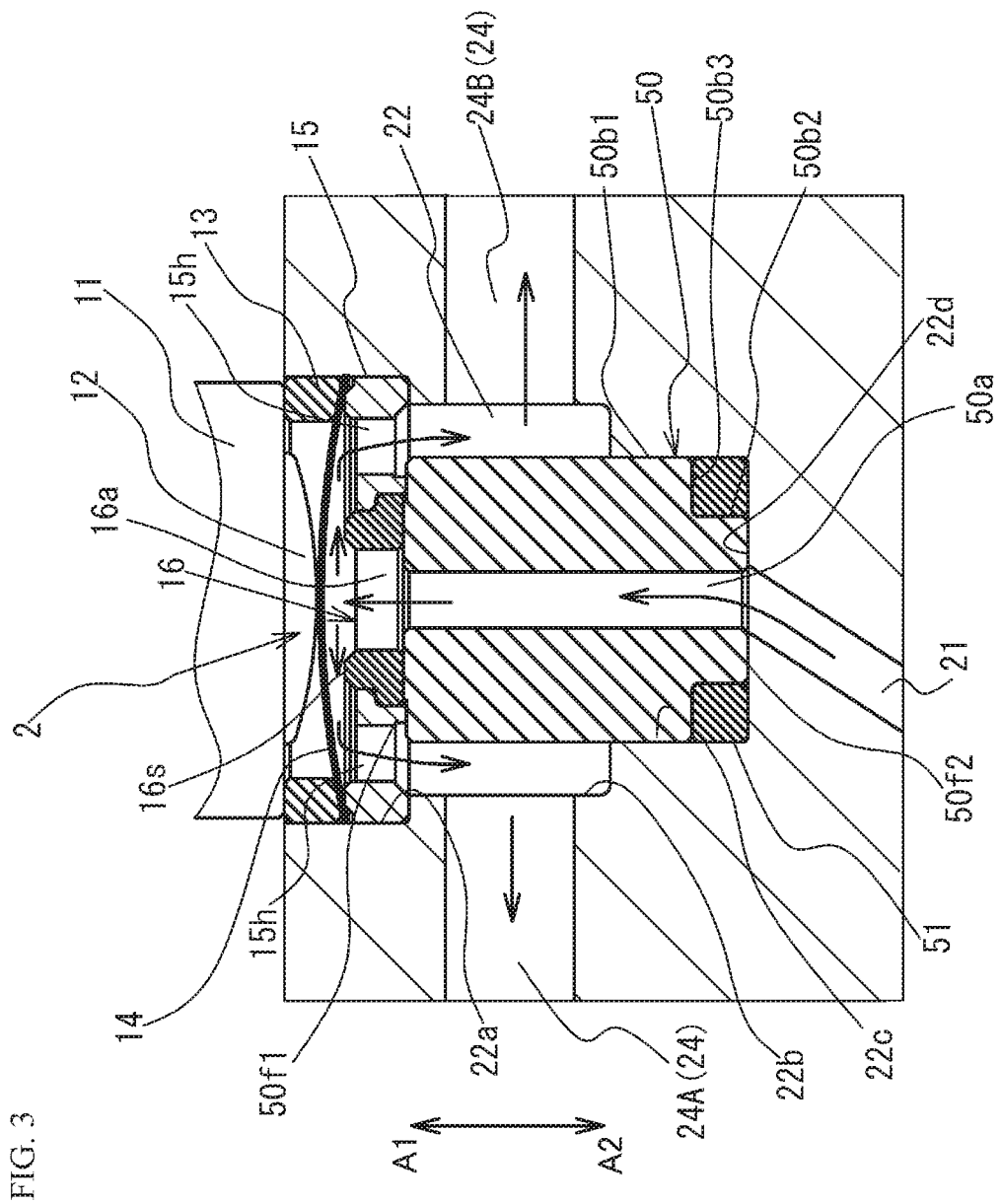
FIG. 3 is an enlarged sectional view of the main part of the valve device of FIG. 1A, showing the valve open condition.
Figure 4:
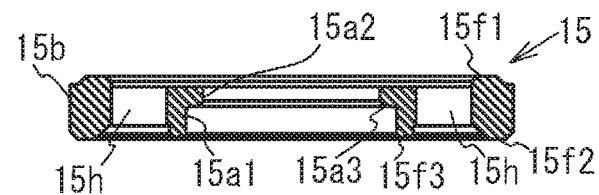
FIG. 4 is a sectional view of the inner disc.
Figure 5:
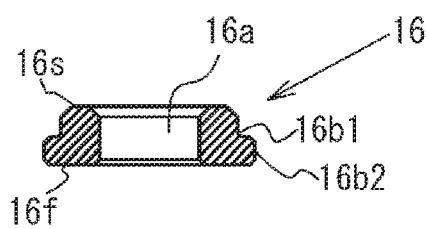
FIG. 5 is a sectional view of the valve seat.
Figure 6:
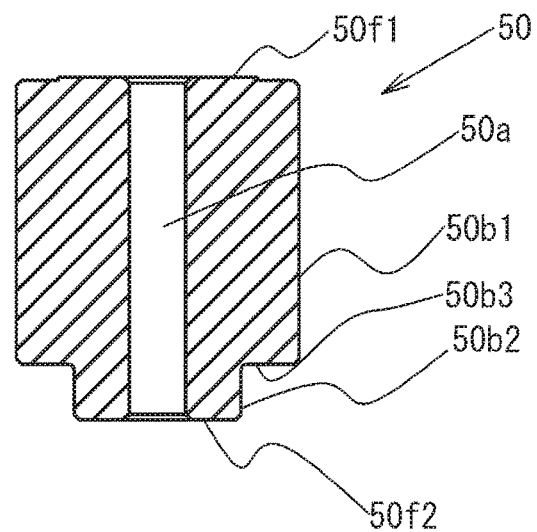
FIG. 6 is a sectional view of the valve seat support.

FIG. 1A to FIG. 1F show the structure of the valve device according to an embodiment of the present invention. FIG. 2 and FIG. 3 show the operation of the valve device of FIG. 1A, FIG. 4 shows the inner disc. FIG. 5 shows the cross-sectional structure of the valve seat and FIG. 6 shows the cross-sectional structure of the valve seat support.

In FIG. 1A to FIG. 3, it is assumed that arrows A1 and A2 in the drawing indicate the vertical direction, A1 indicates the upward direction, and A2 indicates the downward direction. Arrows B1 and B2 indicate the longitudinal direction of the valve body 20 of the valve device 1, and B1 indicates one end side and B2 indicates the other end side. It is assumed that C1 and C2 indicate the width directions orthogonal to the longitudinal directions B1 and B2 of the valve body 20, and C1 indicates the front side and C2 indicates the back side.

The valve body 20 is a block-shaped member having a rectangular shape in a top view, and defines a top surface 20/1 and a bottom surface 20/2, and four side surfaces 20/3 to 20/6 extending between the top surface 20/1 and the bottom surface 20/2. In addition, it defines a accommodation recess 22 which opens at the top surface 20/1. As can be seen from FIG. 2 and the like, the accommodation recess 22 is composed of inner peripheral surfaces 22a, 22b, and 22c having different diameters and a bottom surface 22d. The diameter of the inner peripheral surfaces 22a, 22b, and 22c decreases in this order. A valve element 2, which will be described later, is incorporated in the accommodation recess 22.

The valve body 20 defines a primary flow path 21 and a secondary flow path 24 connected to the accommodation recess 22. The primary flow path 21 is a flow path on the side where a fluid such as a gas is supplied from the outside through the valve element 2, and the secondary flow path 24 is a flow path through which a fluid such as a gas flows out to the outside. The primary flow path 21 is inclined with respect to the bottom surface 20f2 of the valve body 20, and opens at the bottom surface 20f2. A seal holding portion 21a (not shown) is formed around the opening of the primary flow path 21. In the seal holding portion 21a, a gasket is disposed as a sealing member. The valve body 20 is connected to another flow path block (not shown) by screwing a fastening bolt into the screw hole 20h1. At this time, since the gasket held by the seal holding portion 21a is crushed by the fastening force of the fastening bolt between the gasket and another flow path block (not shown), the periphery of the opening of the primary flow path 21 is sealed.

Examples of the gasket include gaskets made of metal or resin. Examples of the gasket include a soft gasket, a semi-metal gasket, and a metal gasket. Specifically, the following is suitably used.
(1) Soft gasket
  Rubber O-ring
  Rubber seat (for full seating)
  Joint seat
  Expanded graphite sheet
  PTFE sheet
  PTFE jacketed type
(2) Semi-metal gasket
  Spiral-wound gasket
  Metal jacket gasket
(3) Metal gasket
  Solid-metal flat gasket
  Metal hollow O-ring
  Ring joint The same applies to the seal holding portions 25a1 and 26b1 provided around the openings of the branch flow paths 25 and 26, which will be described later, and a detailed description thereof will be omitted.

The secondary flow path 24 includes two secondary flow paths 24A and 24B formed on opposite sides with respect to the accommodation recess 22 in the longitudinal directions B1 and B2 of the valve body 20. The secondary flow paths 24A and 24B are formed on a common axis J1 extending in the longitudinal directions B1 and B2 of the valve body 20. One end of the secondary flow path 24A is opened at the inner peripheral surface 22b of the accommodation recess 22, and the other end 24a1 is closed inside the valve body 20. One end of the secondary flow path 24B is opened on the inner peripheral surface 22b of the accommodation recess 22, and the other end 24b1 is opened on the side surface 20f6. The opening of the side surface 20f6 of the secondary flow path 24B is provided with a blocking member 30 by means of welding or the like, and the opening of the secondary flow path 24B is blocked. The secondary flow paths 24A and 24B can be easily machined using a tool such as a drill.

The secondary flow path 24A branches into two branch flow paths 25 at the other end 24a1, and they open at the top surface 20f1. The secondary flow path 24B branches into two branch flow paths 26 in the middle, and they open at the top surface 20f1.

That is, in the valve device 1 according to the present embodiment, a fluid such as a gas flowing into the primary flow path 21 can be divided into four by the branch flow paths 25 and 26 of the secondary flow path 24.

The valve element 2 comprises a diaphragm 14, an inner disk 15, a valve seat 16 and a valve seat support 50. The valve element 2 blocks direct communication between the primary flow path 21 and the secondary flow path 24 through the accommodation recess 22, and the primary flow path 21 and the secondary flow path 24 communicate through the valve element 2. Hereinafter, the valve element 2 will be described in detail.

A valve seat support 50 having an outer diameter that fits with the inner peripheral surface 22c is inserted into the accommodation recess 22. As shown in FIG. 6, the valve seat support 50 is a cylindrical metallic member, and has a detour passage 50a formed of a through hole at the center, and a ring-shaped support surface 50f1 centered on the detour passage 50a formed at the upper end. The support surface 50f1 of the valve seat support 50 is formed of a flat surface, and a step is formed on an outer peripheral portion of the support surface 50f1. The valve seat support 50 has a bottom surface 50f2. The outer peripheral surface 50b1 of the valve seat support 50 has a diameter to fit into the inner peripheral surface 22c of the accommodation recess 22, there is a step between the outer peripheral surface 50b2 which is reduced in diameter of the lower end side. An annular end surface 50b3 is formed by the step. As shown in FIG. 2 or the like, a sealing member 51 made of a plastic such as PTFE or the like is fitted into the outer peripheral surface 50b2. The sealing member 51 is formed to have a rectangular cross-sectional shape, and has a dimension to be crushed between the bottom surface 22d of the accommodation recess 22 and the end surface 50b3 of the valve seat support 50, as described later. When the sealing member 51 is crushed between the bottom surface 22d of the accommodation recess 22 and the end surface 50b3 of the valve seat support 50, resin enters between the outer peripheral surface 50b1 of the valve seat support 50 and the inner peripheral surface 22c and the bottom surface 22d of the accommodation recess 22, and the space between the valve seat support 50 and the accommodation recess 22 is reliably sealed. That is, the outer peripheral surface 50b2 and the end surface 50b3 serving as the sealing surfaces cooperate with the inner peripheral surface 22c and the bottom surface 22d of the accommodation recess 22 to block the communication between the primary flow path 21 and the secondary flow path 24.

The detour passage 50a of the valve seat support 50 is connected to the primary flow path 21 that opens at the bottom surface 22d of the accommodation recess 22.

A valve seat 16 is provided on a support surface 50f1 of the valve seat support 50.

The valve seat 16 is formed of a resin such as PFA or PTFE so as to be elastically deformable, and, as shown in FIG. 5, the valve seat 16 is formed in an annular shape, and an annular seating surface 16s is formed on one end surface and an annular sealing surface 16f is formed on the other end surface. Inside the seating surface 16s and the sealing surface 16f, a flow passage 16a formed of a through hole is formed. The valve seat 16 has a small diameter portion 16b1 and a large diameter portion 16b2 on the outer peripheral side thereof, and a step portion is formed between the small diameter portion 16b1 and the large diameter portion 16b2.

The valve seal 16 is positioned with respect to the support surface 50f1 of the valve seat support 50 by the inner disk 15 as a positioning and pressing member, and is pressed toward the support surface 50f1 of the valve seat support 50. Specifically, a large diameter portion 15a1 and a small diameter portion 15a2 formed in the center portion of the inner disk 15 are formed, and a stepped surface 15a3 is formed between the large diameter portion 15a1 and the small diameter portion 15a2. An annular flat surface 15f1 is formed on one end surface side of the inner disk 15. An annular flat surface 15f2 is formed on the outer side on the other end surface side of the inner disk 15, and an annular flat surface 15f3 is formed on the inner side. The flat surface 15f2 and the flat surface 15f3 have different heights, and the flat surface 15f3 is positioned closer to the flat surface 15f1. An outer peripheral surface 15b that fits into the inner peripheral surface 22a of the accommodation recess 22 is formed on the outer peripheral side of the inner disk 15. Further, a plurality of flow paths 15h passing from one end surface to the other end surface are formed at equal intervals in the circumferential direction. The large diameter portion 16b2 and the small diameter portion 16b1 of the valve seat 16 are fitted to the large diameter portion 15a1 and the small diameter portion 15a2 of the inner disk 15, whereby the valve seat 16 is positioned with respect to the support surface 50f1 of the valve seat support 50.

The flat surface 15f2 of the inner disk 15 is disposed on a flat step surface formed between the inner peripheral surface 22a and the inner peripheral surface 22h of the accommodation recess 22. A diaphragm 14 is disposed on a flat surface 15f1 of the inner disk 15, and a holding ring 13 is disposed on the diaphragm 14.

The actuator 10 is driven by a driving source such as a pneumatic pressure, and drives the diaphragm presser 12 movably held in the vertical directions A1 and A2. The tip end portion of the casing 11 of the actuator 10 is screwed into and fixed to the valve body 20 as shown in FIG. 1A. The tip end portion presses the holding ring 13 downward direction A2, and the diaphragm 14 is fixed in the accommodation recess 22. The diaphragm 14 seals the accommodation recess 22 on the opening side. In addition, the inner disk 15 is also pressed downward direction A2. The height of the step surface 15a3 is set so that the step surface 15a3 presses the valve seat 16 toward the support surface 50f1 of the valve seat support 50 in a state in which the flat surface 15f2 of the inner disk 15 is pressed against the step surface of the accommodation recess 22. The flat surface 15f3 of the inner disk 15 does not abut against the upper end surface of the valve seat support 50.

The diaphragm 14 has a diameter larger than the diameter of the valve seat 16, and is formed of a metal such as stainless steel or a NiCo based alloy, or a fluorinated resin in a spherical shell shape so as to be elastically deformable. The diaphragm 14 is supported by the valve body 20 so as to be able to abut against and separate from the seating surface 16s of the valve seat 16.

In the FIG. 2, the diaphragm 14 is pressed and elastically deformed by the diaphragm presser 12, and is pressed against the seating surface 16s of the valve seat 16. When the pressing force by the diaphragm presser 12 is released, the diaphragm 14 is restored to a spherical shell shape as shown in FIG. 3. When the diaphragm 14 is pressed against the seating surface 16s of the valve seat 16, the flow path between the primary flow path 21 and the secondary flow path 24 is closed. When the diaphragm presser 12 is moved upward A1, the diaphragm 14 moves away from the seating surface 16s of the valve seat 16, as shown in FIG. 3. The fluid supplied from the primary flow path 21 flows through the gap between the diaphragm 14 and the seating surface 16s of the valve seat 16, into the secondary flow paths 24A and 24B, and finally flows out of the valve body 20 through the branch flow paths 25 and 26.

As described above, according to the present embodiment, the accommodation recess 22 is provided in the valve body 20, the valve seat support 50 is accommodated in the accommodation recess 22, the communication between the primary flow path 21 and the secondary flow path 24 is blocked, and the flow passage 16a of the valve seat 16 supported by the valve seal support 50 and the primary flow path 21 are connected by the detour passage 50a of the valve seat support 50. As a result, the primary flow path 21 and the secondary flow path 24 need only be connected to the accommodation recess 22, and the degree of freedom in the arrangement of the primary flow path 21 and the secondary flow path 24 is drastically increased. That is, as in the present embodiment, it is possible to extend the secondary flow path 24 in the longitudinal directions B1 and B2, and optimization of the arrangement of the flow path becomes very easy. By optimizing the arrangement of the primary flow path 21 and the secondary flow path 24, it is possible to further downsize the valve body 20.

In the above embodiment, the secondary flow path 24 is branched into a plurality in the valve body 20, the case where the branch flow paths 25 and 26 open at the top surface 20f1 of the valve body 20 has been exemplified, the present invention is not limited thereto, and a configuration in which they open at the bottom surface 20f2 or any of the side surfaces 20f3 to 20f6 can also be adopted.

In the above embodiment, the inner disk 15 and the valve seat 16 are separate members, but it is also possible to integrate the inner disk 15 and the valve seat 16.

Figure 7:
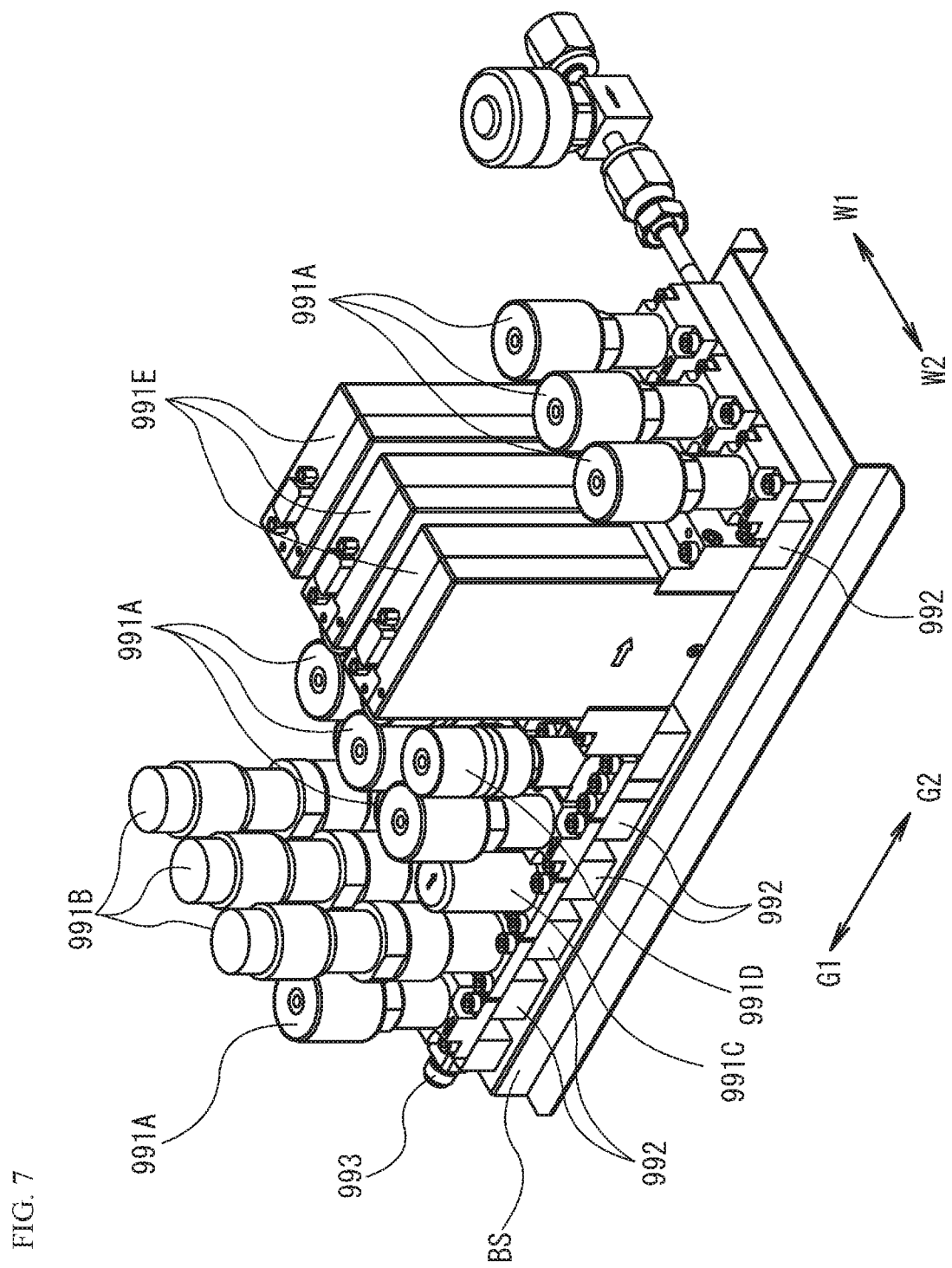
FIG. 7 is a perspective view showing an exemplary fluid control device using a valve device according to an embodiment of the present invention.

Referring to FIG. 7, an exemplary fluid control device to which the valve device 1 according to the above embodiment is applied will be described.

The fluid control device shown in FIG. 7 is provided with metallic baseplates BS arranged along the widthwise directions W1, W2 and extending in the longitudinal directions G1, G2. Note that W1 represents the front side, W2 represents the back side, G1 represents the upstream side, and W2 represents the downstream side. Various fluid devices 991A to 991E are installed on the base plate BS via a plurality of flow path blocks 992, and a flow path (not shown) through which a fluid flows from the upstream side G1 toward the downstream side G2 is formed by the plurality of flow path blocks 992.

Here, a "fluid device" is a device used in a fluid control device for controlling a flow of a fluid, and includes a body defining a fluid flow path, and has at least two flow path ports opening at a surface of the body. Specific examples include, but are not limited to, an open-close valve (two-way valve) 991A, a regulator 991B, a pressure gauge 9910, an open-close valve (three-way valve) 991D, a mass flow controller 991E which is a flow rate control device, and the like. The introducing pipe 993 is connected to a flow passage port on the upstream side of the flow passage (not shown) described above.

The valve device 1 according to the present embodiment is applicable to the mass flow controller 991E described above, and the flow rate of the fluid is controlled by the mass flow controller 991E. The valve device 1 according to the present embodiment can be applied to valves such as an open-close valve (two-way valve) 991A, a regulator 991B, a pressure gauge 991C, and an open-close valve (three-way valve) 991D.

Figure 8:
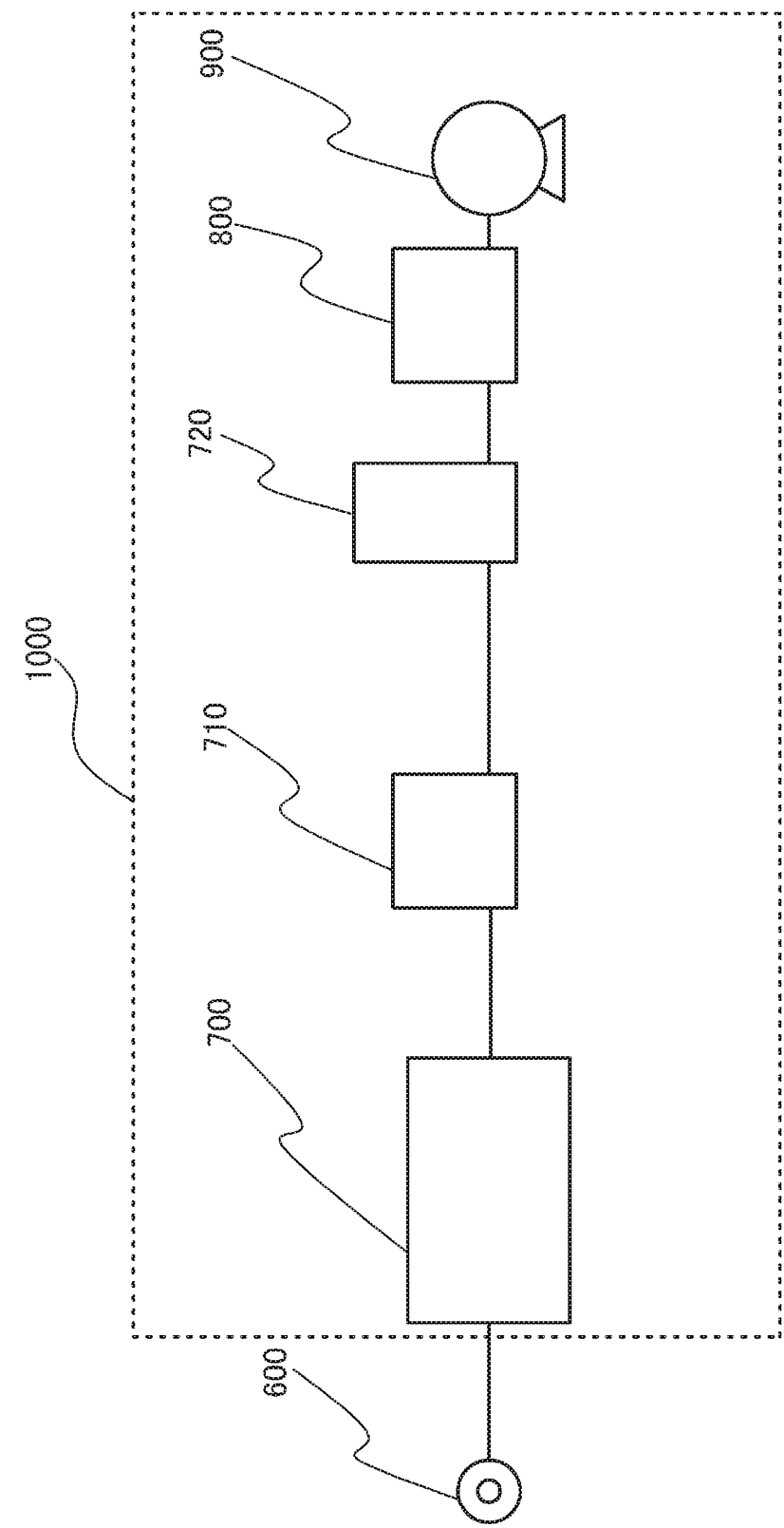
FIG. 8 is a schematic diagram showing an exemplary semiconductor manufacturing apparatus to which a valve device according to an embodiment of the present invention is applied.

Next, FIG. 8 shows an example of a semiconductor manufacturing apparatus to which the above-mentioned fluid control device is applied.

A semiconductor manufacturing apparatus 1000 is a system for performing a semiconductor manufacturing process using atomic layer deposition (ALD: Atomic Layer Deposition method), where 600 is a process gas supply source, 700 is a gas box, 710 is a tank, 800 is a processing chamber, and 900 is an exhaust pump. The fluid control device shown in FIG. 7 is housed in a gas box 700.

In a treatment process that deposits a film on a substrate, in order to stably supply a process gas, a process gas supplied from a gas box 700 is temporarily stored in a tank 710 as a buffer, and a valve 720 provided in the immediate vicinity of the processing chamber 800 is opened and closed at high frequency to supply the process gas from the tank to the processing chamber of a vacuum atmosphere.

The ALD method is one of chemical vapor deposition methods, in which two or more types of process gases are alternately flowed on the substrate surface under film forming status such as temperature and time to react with atoms on the substrate surface to deposit a film layer by layer. This method allows control per atom layer, making it possible to form a uniform film thickness and grow the film very finely, even in terms of film quality.

In the semiconductor manufacturing process by the ALD method, it is necessary to precisely adjust the flow rate of the process gas, and it is also necessary to secure the flow rate of the process gas to some extent by increasing the diameter of the substrate or the like.

A gas box 700 containing a fluid control device provides an accurately metered amount of process gas to the processing chamber 800. The tank 710 functions as a buffer for temporarily storing the process gas supplied from the fluid control device 700, The processing chamber 800 provides a sealed processing space for forming a film on a substrate by an ALD method.

The exhaust pump 900 draws a vacuum inside the processing chamber 800.

The present invention is not limited to the above-described embodiments. Various additions, modifications, and the like can be made by those skilled in the art within the scope of the present invention. For example, in the application example described above, the valve device 1 is used in a semiconductor manufacturing process by the ALD method, but the present invention is not limited to this, and the present invention can be applied to any object requiring precise flow rate control, such as an atomic layer etching (ALE: Atomic Layer Etching) method.

REFERENCE SIGNS LIST

1: Valve device
2: Valve element
10: Actuator
11: Casing
12: Diaphragm presser
13: Holding ring
14: Diaphragm
15: Inner disk
15h: Flow path
16: Valve seat
16a: Flow passage
16f: Sealing surface
16s: Seating surface
20: Valve body
20f1: Top surface
20f2: Bottom surface
20f3-20f6: Side surface
20h1: Screw hole
21: Primary flow path
21a: Seal holding portion
24A, 24B, 24: Secondary flow path
25, 26: Branch flow path
30: Blocking member
50: Valve seat support
50a: Detour passage
50f1: support surface
50b2, 50b3: Sealing surface
51: Sealing member
600: Process gas supply source
700: Gas box
710: Tank
720: Valve
800: Processing chamber
900: Exhaust pump
1000: Semiconductor manufacturing apparatus
991A: open-close valve (two-way valve)
991B: Regulator
991C: Pressure gauge
991D: open-close valve (three-way valve)
991E; Mass flow controller
992: Flow path block
993: introducing pipe
A1: upward
A2: downward
BS: Base plate
J1: Axis
W1: Width direction
W2: Width direction

The invention claimed is:

1. A valve device, comprising:
a block-shaped valve body,
the valve body defining an accommodation recess open at a surface of the valve body and containing a valve element, and primary and secondary flow paths connected to the accommodation recess,
the valve element blocking direct communication between the primary flow path and the secondary flow path through the accommodation recess, and making the primary flow path and the secondary flow path communicate through the valve element,
the valve element comprising:
a valve seat having a flow passage;
a valve seat support that supports the valve seat; and
a diaphragm configured to selectively communicate the primary flow path and the secondary flow path via the flow passage,
wherein the secondary flow path is in direct communication with the accommodation recess such that fluid passing through the primary flow path and the flow passage flows along an outer surface of the valve seat support and into the secondary flow path; and
wherein
the valve body defines opposing top and bottom surfaces and side surfaces extending between the top and bottom surfaces,
the accommodation recess is open at the top surface of the valve body,
the valve seat having a seating surface that is annular and formed on one end surface, a sealing surface that is annular and formed on the other end surface, and the flow passage is formed inside the seating surface and the sealing surface and passing from the one end surface to the other end surface,
the valve seat support is provided in the accommodation recess and having a support surface against which the sealing surface of the valve seat abuts and which supports a pressing force from the sealing surface of the valve seat, and the diaphragm provided in the accommodation recess so as to abut and be separated from the seating surface supported by the valve seat support, the diaphragm making the flow passage and the secondary flow path communicate through a gap between the diaphragm and the seating surface, the valve seat support having a sealing surface that cooperates with a part of an inner wall surface of the accommodation recess to block the direct communication between the primary flow path and the secondary flow path, and a detour passage that connects the primary flow path and the flow passage, and the valve device further comprising a sealing member provided between a part of the inner wall surface of the accommodation recess and the sealing surface of the valve seat support.

2. The valve device according to claim 1, wherein the primary flow path opens at the bottom surface of the valve body, the secondary flow path branches into a plurality of branch flow paths in the valve body, and the plurality of branch flow paths each opens at any of the top, bottom and side surfaces.

3. The valve device according to claim 1, wherein the secondary flow path includes first and second secondary flow paths formed on opposite sides of the accommodation recess in the longitudinal direction of the valve body, one end of the first and second secondary flow paths is closed in the longitudinal direction within the valve body, and the other end of the first and second secondary flow paths is open at a corresponding side surface of the accommodation recess.

4. The valve device according to claim 3, wherein the first and second secondary flow paths are formed on a common axis extending in the longitudinal direction of the valve body.

5. The valve device according to claim 1, wherein the sealing member is configured to be crushed between the inner wall surface of the accommodation recess and the valve seat support by receiving a pressing force from the valve seat.

6. The valve device according to claim 1, further comprising a disk-shaped member that positions and presses the valve seat with respect to the support surface and pressing the valve seat toward the support surface, wherein the disk-shaped member has a flow path for making the flow passage and the secondary flow passage communicate through a gap between the diaphragm and the seating surface.

7. The valve device according to claim 6, wherein the disk-shaped member is disposed between the valve body and the diaphragm.

8. The valve device according to claim 6, further comprising an actuator for driving the diaphragm, wherein a casing containing the actuator is screwed into the valve body, and the disk-shaped member presses the valve seat toward the support surface by using a screwing force of the casing.

9. A flow rate control device for controlling a flow rate of a fluid, comprising the valve device as claimed in claim 1.

10. A fluid control device comprising a plurality of fluid devices, wherein the plurality of fluid devices includes the valve device as claimed in claim 1.

* * * * *